United States Patent
Nakamura et al.

(10) Patent No.: US 12,132,483 B2
(45) Date of Patent: Oct. 29, 2024

(54) INTEGRATED CIRCUIT

(71) Applicant: FUJI ELECTRIC CO., LTD., Kawasaki (JP)

(72) Inventors: Hiroshi Nakamura, Matsumoto (JP); Hiroyuki Nakajima, Matsumoto (JP); Takanori Kohama, Matsumoto (JP); Yuya Abe, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 275 days.

(21) Appl. No.: 17/726,346

(22) Filed: Apr. 21, 2022

(65) Prior Publication Data
US 2022/0368316 A1    Nov. 17, 2022

(30) Foreign Application Priority Data
May 17, 2021    (JP) .................................. 2021-083502

(51) Int. Cl.
*H03K 3/01*    (2006.01)
*H01F 38/12*   (2006.01)
*H03K 17/567*  (2006.01)

(52) U.S. Cl.
CPC ............... *H03K 3/01* (2013.01); *H01F 38/12* (2013.01); *H03K 17/567* (2013.01)

(58) Field of Classification Search
CPC .... H03K 3/01; H03K 17/0828; H03K 17/567; H03K 17/08128; H03K 17/162; H01F 38/12; F02P 3/0414
USPC ........................................................ 361/263
See application file for complete search history.

(56) References Cited

U.S. PATENT DOCUMENTS

2017/0373583 A1* 12/2017 Nakajima .......... H03K 17/0828

FOREIGN PATENT DOCUMENTS

| JP | 2001-153012 A | 6/2001 |
| JP | 2002-371945 A | 12/2002 |
| JP | 2006-037822 A | 2/2006 |
| JP | 2008-045514 A | 2/2008 |
| JP | 5181834 B2 | 4/2013 |
| JP | 2014-013796 A | 1/2014 |
| JP | 2016-035220 A | 3/2016 |
| JP | 2018-007539 A | 1/2018 |

OTHER PUBLICATIONS

Of Lepkowski and Johnson "Zener Diode Based Integrated Filters, An Alternative To Traditional EMI Filter Devices" Nov. 2004 (Year: 2004).*

* cited by examiner

*Primary Examiner* — Kevin J Comber
(74) *Attorney, Agent, or Firm* — Rabin & Berdo, P.C.

(57) ABSTRACT

An integrated circuit for controlling an ignition system including a coil. The integrated circuit includes a transistor configured to control a current flowing through the coil, a first line coupled to a control electrode of the transistor, a second line coupled to an electrode of the transistor on the ground side thereof, a control circuit configured to control on and off of the transistor based on a voltage level of the first line, and a Zener diode having a cathode coupled to the first line and an anode coupled to the second line. The Zener diode has such a capacitance that, when a first signal, and a second signal of a higher frequency, are inputted to the first line, the control circuit controls the on and off of the transistor in response to the first signal irrespective of the second signal.

10 Claims, 6 Drawing Sheets

INTEGRATED CIRCUIT

CROSS-REFERENCE TO RELATED APPLICATION

The present application claims priority pursuant to 35 U.S.C. § 119 from Japanese patent application number 2021-083502 filed on May 17, 2021, the entire disclosure of which is hereby incorporated by reference herein.

BACKGROUND

Technical Field

The present disclosure relates to an integrated circuit.

Description of the Related Art

There are integrated circuits used for an ignition system of an internal combustion engine (e.g., Japanese Patent Application Publication No. 2001-153012, Japanese Patent Application Publication No. 2002-371945, Japanese Patent Application Publication No. 2008-045514, Japanese Patent Application Publication No. 2006-037822, Japanese Patent Application Publication No. 2014-013796, Japanese Patent Application Publication No. 2016-035220, Japanese Patent No. 5181834, and Japanese Patent Application Publication No. 2018-007539).

Incidentally, such an integrated circuit may include an insulated gate bipolar transistor (IGBT) and a control circuit for controlling on and off of the IGBT, in a single chip. Then, such a control circuit may operate with a voltage of a line coupled to a gate electrode of the IGBT as a power supply. In such a control circuit, noise is superimposed on the line, and when a voltage level of the line fluctuates, the control circuit may malfunction such that the IGBT may not be appropriately turned on and off.

SUMMARY

An aspect of an embodiment of the present disclosure is an integrated circuit for controlling an ignition system including a coil, the integrated circuit comprising: a transistor configured to control a current flowing through the coil, the transistor having an electrode on a ground side thereof and a control electrode; a first line coupled to the control electrode of the transistor, the first line being configured to have a first signal and a second signal inputted thereto, a frequency of the second signal being higher than that of the first signal; a second line coupled to the electrode of the transistor on the ground side thereof; a control circuit configured to control on and off of the transistor, based on a voltage level of the first line; and a Zener diode having a cathode coupled to the first line and an anode coupled to the second line, the Zener diode having such a capacitance that, responsive to the first signal and the second signal being both inputted to the first line, the control circuit controls the on and off of the transistor in response to the first signal irrespective of the second signal.

DETAILED DESCRIPTION

At least following matters will become apparent from the descriptions of the present specification and the accompanying drawings.

EMBODIMENT

<<One-Chip Igniter>>

Figure 1:
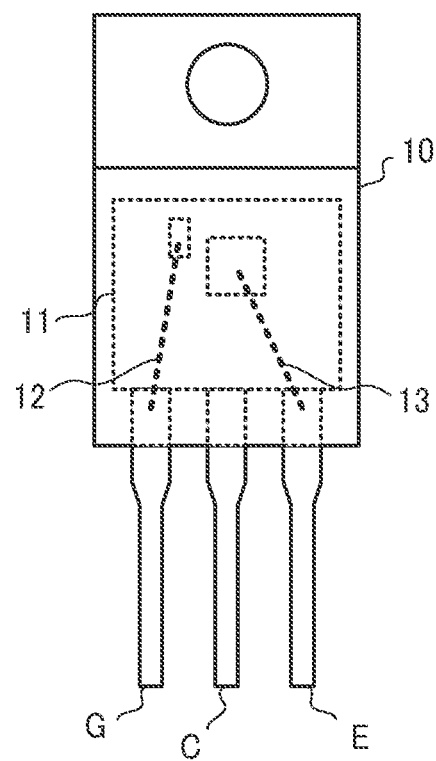
FIG. 1 is a diagram illustrating an example of an igniter 10.

FIG. 1 is a diagram illustrating an example of an igniter 10, which is an embodiment of the present disclosure. The igniter 10 is a semiconductor module used in an ignition system 20 which will be described later. The igniter 10 is a one-chip igniter having a gate (G) terminal, a collector (C) terminal, and an emitter (E) terminal (which are hereinafter referred to "G terminal", "C terminal", and "E terminal", respectively), and including an integrated circuit 11.

The G terminal is coupled to a gate electrode of an insulated gate bipolar transistor (IGBT) (described later), which is formed in a front surface of the integrated circuit 11 through a wire 12. The E terminal is coupled to an emitter electrode of the IGBT, which is also formed in the front surface of the integrated circuit 11 through a wire 13. In addition, the C terminal is coupled to a collector electrode (not illustrated) of the IGBT, which is formed in a back surface of the integrated circuit 11. Note that details of a relationship between the integrated circuit 11, and the G terminal, C terminal, and E terminal will be described later. Note that the gate electrode to which the G terminal is coupled corresponds to a "control electrode".

<<Example of Configuration of Integrated Circuit 11>>

Figure 2:
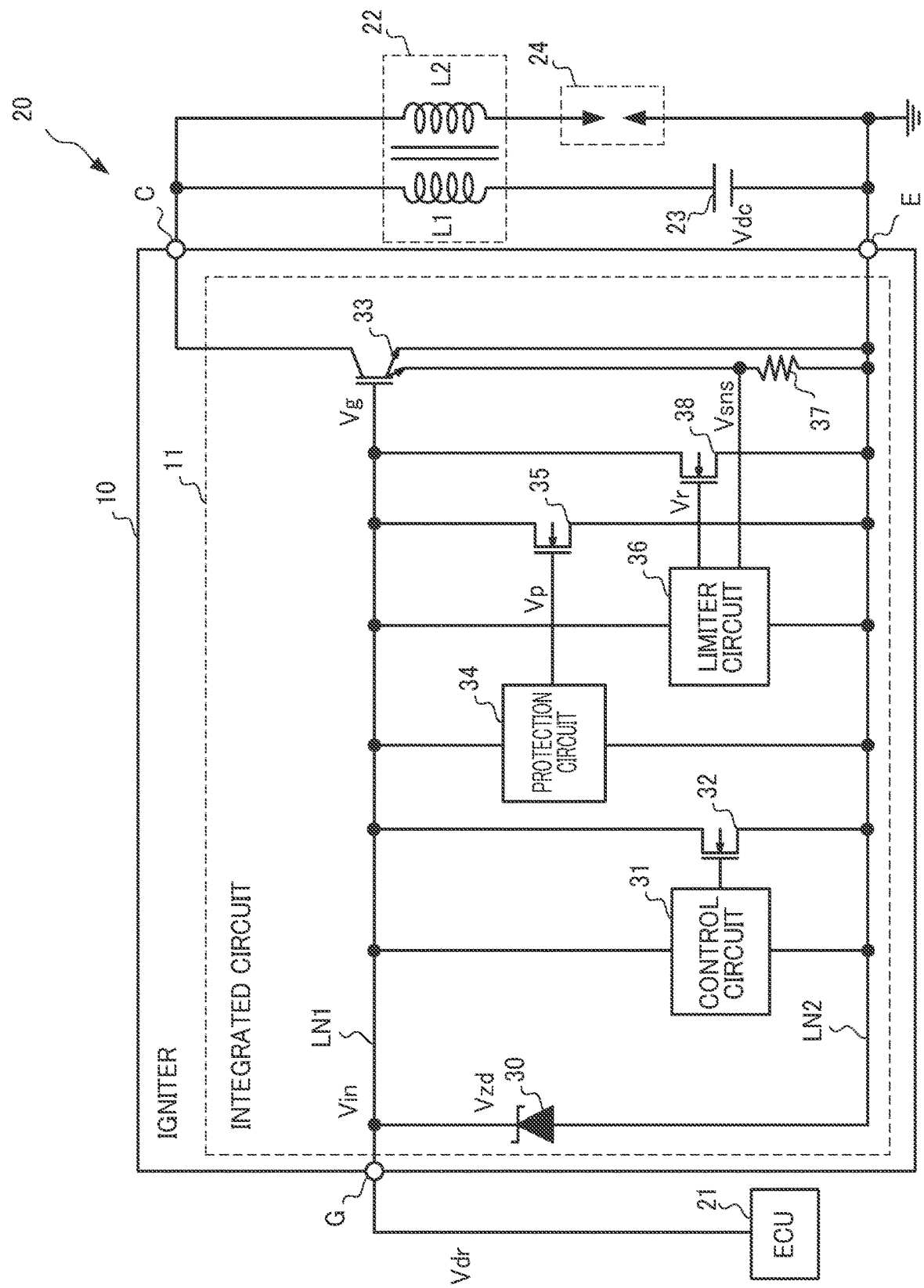
FIG. 2 is a diagram for explaining details of an integrated circuit 11.

FIG. 2 is a diagram for explaining details of the integrated circuit 11. The integrated circuit 11 controls on and off of an IGBT 33 to be described later, in response to a drive signal Vdr from an electronic control unit (ECU) 21 to be described later.

The integrated circuit 11 includes a Zener diode 30, a control circuit 31, NMOS transistors 32, 35, 38, the IGBT 33, a protection circuit 34, a limiter circuit 36, and a resistor 37. The Zener diode 30 is provided between the G terminal and the E terminal of the igniter 10.

The Zener diode 30 has a cathode coupled to a first line LN1 to which the G terminal is coupled, and an anode coupled to a second line LN2 to which the emitter electrode (i.e., an electrode on the ground side) of the IGBT 33 is coupled. In addition, in response to an input voltage Vin inputted to the first line LN1 exceeding a breakdown voltage Vzd (e.g., 7V) of the Zener diode 30, the Zener diode 30 clamps the input voltage Vin to the breakdown voltage Vzd.

On the other hand, in response to the input voltage Vin exceeding a forward voltage Vf of the Zener diode 30 and becoming a negative voltage, the Zener diode 30 is turned on and clamps the input voltage Vin to the negative voltage corresponding to the forward voltage Vf of the Zener diode 30. In addition, the Zener diode 30 has a junction capacitance Cb, which will be described later in detail.

<<Control Circuit 31>>

The control circuit 31 controls on and off of the IGBT 33, based on a voltage level of the input voltage Vin inputted to the first line LN1. Specifically, in response to the input voltage Vin exceeding a threshold voltage VthH (e.g., 2.8V), the control circuit 31 turns off the NMOS transistor 32. Then, in response to turning off of the NMOS transistor 32, a gate voltage Vg results in the input voltage Vin and the IGBT 33 is turned on. Note that the threshold voltage VthH is higher than a threshold voltage Vth (e.g., 1.5V) of the IGBT 33.

In addition, in response to the input voltage Vin dropping below a threshold voltage VthL (e.g., 2.5V), which is lower than the threshold voltage VthH, the control circuit 31 turns on the NMOS transistor 32. In response to turning on of the NMOS transistor 32, the gate voltage Vg results in a ground voltage and the IGBT 33 is turned off. In this manner, the control circuit 31 turns on and off the NMOS transistor 32 based on the level of the input voltage Vin, to thereby control a state of the IGBT 33.

Note that, in an embodiment of the present disclosure, the control circuit 31 includes, for example, an inverter (not illustrated) with the threshold voltage VthH as a threshold voltage, an inverter (not illustrated) with the threshold voltage VthL as a threshold voltage, and other circuit elements. In addition, the threshold voltage VthH corresponds to a "first level" and the threshold voltage VthL corresponds to a "second level".

<<IGBT 33>>

The IGBT 33 is a switching device that controls a current flowing through an ignition coil 22 to be described later. The IGBT 33 according to an embodiment of the present disclosure includes a sense IGBT for detecting a current. Then, a current flowing through the sense IGBT corresponds to a collector current Ic flowing through the IGBT 33, and flows to the E terminal of the igniter 10 through the resistor 37 to be described later.

<<Protection Circuit 34>>

The protection circuit 34 protects the IGBT 33 from permanent damage caused by high temperature. Specifically, the protection circuit 34 is formed in the integrated circuit 11, to detect a temperature of the IGBT 33 in response to an output of a diode (not illustrated) that functions as a temperature sensor. When the temperature of IGBT 33 is higher than a predetermined temperature, the protection circuit 34 turns off the IGBT 33.

Meanwhile, the temperature of the IGBT 33 rises in response to the IGBT 33 being turned on and a current flowing through the IGBT 33. Accordingly, the protection circuit 34 should operate before the IGBT 33 is turned on. Thus, the protection circuit 34 according to an embodiment of the present disclosure detects whether or not the temperature of the IGBT 33 is equal to or higher than the predetermined temperature, in response to the voltage level of the input voltage Vin reaching a predetermined level lower than the level of the threshold voltage VthH.

Then, in response to the input voltage Vin exceeding the threshold voltage VthH and the temperature of the IGBT 33 exceeding the predetermined temperature, the protection circuit 34 outputs a voltage Vp, which is the gate voltage Vg, to turn on the NMOS transistor 35. In response to turning on of the NMOS transistor 35, the gate voltage Vg results in the ground voltage, and the IGBT 33 is turned off. This causes the current flowing through the IGBT 33 to be zero, and thus the protection circuit 34 can prevent a temperature of the IGBT 33 from rising. In this manner, in response to the temperature of the IGBT 33 exceeding the predetermined temperature while the IGBT 33 is on, the protection circuit 34 can turn off the IGBT 33. Accordingly, the protection circuit 34 can surely protect the IGBT 33 from permanent damage caused by high temperature.

<<Limiter Circuit 36>>

The limiter circuit 36 limits the current flowing through the IGBT 33. Specifically, the limiter circuit 36 detects whether or not the collector current flowing through the IGBT 33 is equal to or higher than a predetermined value (e.g., 13 A), and limits the collector current flowing through the IGBT 33 so as not to become equal to or higher than the predetermined value.

Meanwhile, in order to limit the collector current flowing through the IGBT 33, the limiter circuit 36 has to operate before the IGBT 33 is turned on. Thus, in response to the voltage level of the input voltage Vin reaching the predetermined level, which is lower than the threshold voltage VthH, the limiter circuit 36 according to an embodiment of the present disclosure detects the collector current flowing through the IGBT 33 based on a voltage generated at the resistor 37.

Then, in response to the collector current becoming equal to or higher than the predetermined value, the limiter circuit 36 outputs a voltage Vr to decrease the gate voltage Vg of the IGBT 33 such that the collector current decreases, to thereby control the NMOS transistor 38. This allows the limiter circuit 36 to limit the collector current to the predetermined value. Accordingly, the limiter circuit 36 can limit the collector current while the IGBT 33 is on, such that the collector current does not become equal to or higher than the predetermined value.

<<Details of Ignition System 20>>

The ignition system 20 is a system to ignite a combustion gas in a cylinder of an internal combustion engine. In addition, the ignition system 20 includes the igniter 10, the ignition coil 22, a direct-current power supply 23, and an ignition plug 24.

The ignition system 20 receives the drive signal Vdr from the ECU 21 at the G terminal of the igniter 10, and causes a spark discharges at the ignition plug 24.

First, in response to the ECU 21 outputting the drive signal Vdr of high level (which is hereinafter referred to as high, and 5V, for example), the voltage level of the first line LN1 coupled to the G terminal rises, and the IGBT 33 is turned on. Then, a voltage at the C terminal of the igniter 10 drops. This causes a direct-current voltage Vdc (e.g., 14V) from the direct-current power supply 23 to be applied to a primary coil L1 of the ignition coil 22, and a current flows through the primary coil L1. Note that the IGBT 33 corresponds to a "transistor" and the primary coil L1 corresponds to a "coil".

Next, in response to the ECU 21 outputting the drive signal Vdr of low level (hereinafter referred to as low, and the ground voltage, for example), the voltage level of the first line LN1 drops, and the IGBT 33 is turned off. Then, the current flowing through the coil L1 rapidly decreases and a voltage across the primary coil L1 rapidly rises. In addition, a voltage across a secondary coil L2 of the ignition coil 22 also rises to several 10 kV (e.g., 30 kV), and the voltage across the secondary coil L2 is applied to the ignition plug 24. In addition, the ignition plug 24 is discharged in response to receiving a voltage of about 10 kV or higher. Thus, in response to the ECU 21 outputting the low drive signal Vdr after outputting the high drive signal Vdr, the ignition plug 24 is discharged.

Incidentally, the igniter 10 is mounted to a vehicle and used to ignite the combustion gas in the cylinder of the internal combustion engine. In addition to the igniter 10, a microcomputer and various types of electronic circuits are also mounted to the vehicle. Accordingly, noise is superimposed on the drive signal Vdr due to noise radiated from such an electronic circuits, and the level of the voltage at the G terminal may fluctuate. If the level of the noise superimposed on the drive signal Vdr is very high, the control circuit 31 and the like in the integrated circuit 11 of the igniter 10 may malfunction and erroneously control on and off of the IGBT 33 because the control circuit 31 and the like operates based on the voltage level at the G terminal or the gate voltage Vg.

<<<Example in which Noise is Superimposed on Drive Signal Vdr>>>

Figure 3:
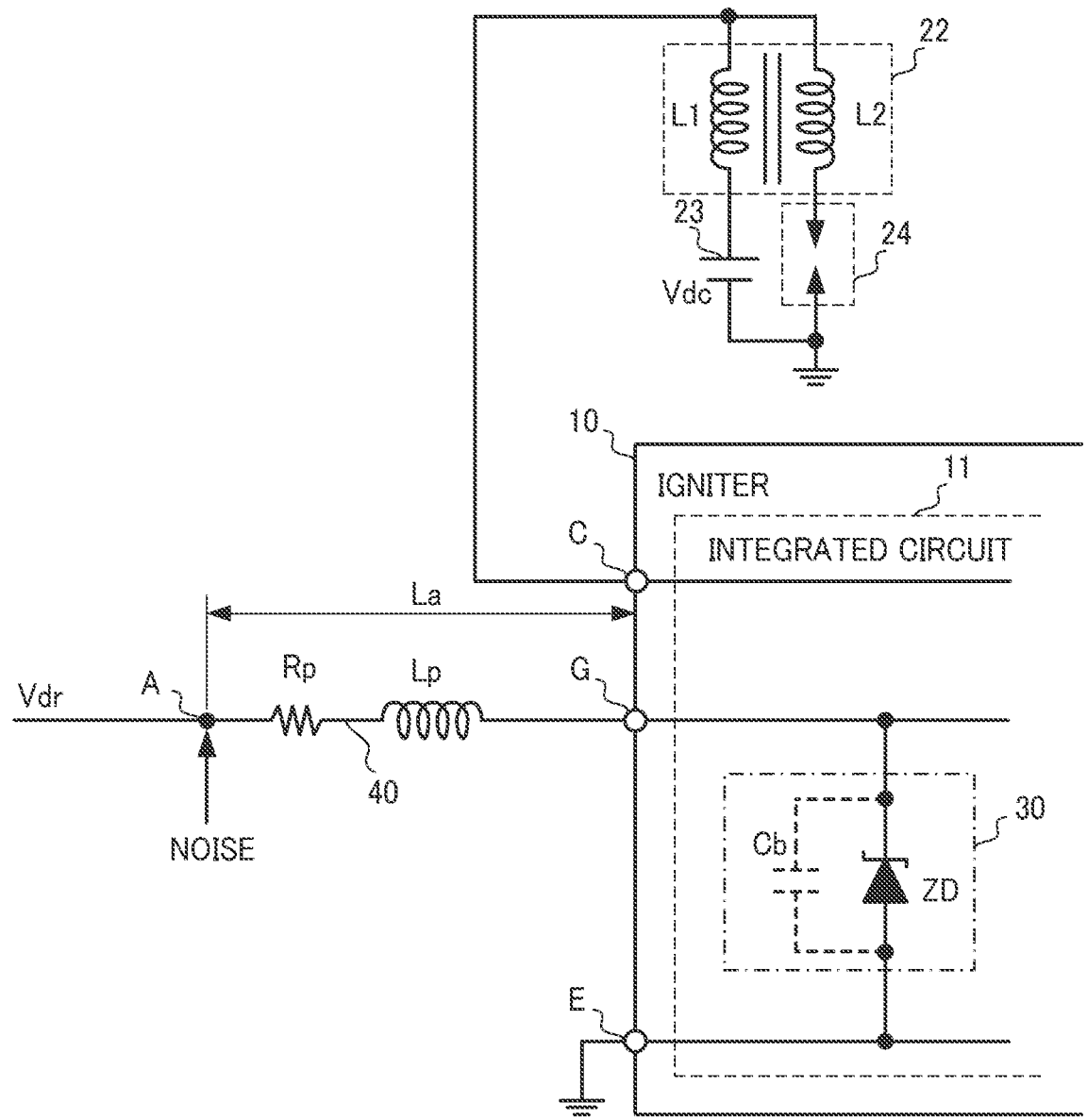
FIG. 3 is a diagram illustrating an example of a wiring diagram when noise is superimposed on a drive signal Vdr.

FIG. 3 is a diagram illustrating an example of a wiring diagram when noise is superimposed on the drive signal Vdr. For example, a current, which is caused by noise at a node A, is injected into the drive signal Vdr outputted from the ECU 21 which is not illustrated. Then, the input voltage Vin obtained by superimposing the noise on the drive signal Vdr is inputted to the first line LN1 through the G terminal. Note that the drive signal Vdr corresponds to a "first signal" and the noise corresponds to a "second signal".

The igniter 10 receives the input voltage Vin and operates based on the voltage level of the input voltage Vin. As illustrated in FIG. 2, the ignition coil 22 and the like are coupled to the C terminal of the igniter 10. In addition, the E terminal of the igniter 10 is grounded.

In FIG. 3, a distance of wiring 40 between the node A and the igniter 10 is referred to as distance La. In addition, it is assumed here that the wiring 40 through which noise is transmitted from the node A to the cathode of the Zener diode 30 has a parasitic resistance Rp and a parasitic inductance Lp. Note that a distance from the G terminal of the igniter 10 to the cathode of the Zener diode 30 is sufficiently shorter than the distance La. Accordingly, in an embodiment of the present disclosure, any parasitic component of the wiring from the G terminal to the cathode of the Zener diode 30 is ignored. Note that the wiring 40 corresponds to a "line".

Moreover, considering the junction capacitance Cb of the Zener diode 30, the junction capacitance Cb configures a low-pass filter, together with the parasitic resistance Rp and the parasitic inductance Lp of the wiring. In addition, when an influence of the parasitic resistance Rp is ignored because the parasitic resistance Rp is sufficiently small, a cut-off frequency fc of the low-pass filter for removing noise is $fc=1/(2\pi\sqrt{LpCb})$ where an inductance value of the parasitic inductance Lp is Lp and a capacitance value of the junction capacitance Cb is Cb. Note that the capacitance value Cb corresponds to a "predetermined capacitance value".

Further, the "junction capacitance Cb" refers to capacitance resulting from a depletion layer generated in a PN junction of the Zener diode 30. The larger a reverse voltage applied to the Zener diode 30, the wider the depletion layer, and thus, the capacitance value Cb of the junction capacitance Cb decreases.

In addition, in an embodiment of the present disclosure, the drive signal Vdr has a frequency of 60 Hz, for example, and noise has a frequency band of 30 MHz to 400 MHz, for example. Thus, the cut-off frequency fc for attenuating noise should be set to a frequency lower than 30 MHz, which is the lowest frequency of the frequency band of the noise. Assuming here that the inductance value Lp is 0.22 pH, the capacitance value Cb when the cut-off frequency fc is a frequency lower than 30 MHz is 128 pF.

In addition, a maximum value of a voltage applied to the first line LN1 is the breakdown voltage Vzd of the Zener diode 30. Thus, in order for the control circuit 31 to be able to control on and off of the IGBT 33 in response to the drive signal Vdr, irrespective of the noise, the junction capacitance Cb of the Zener diode 30 when the input voltage Vin is the breakdown voltage Vzd or higher only has to be 130 pF or higher. Note that the noise frequency corresponds to a "predetermined frequency".

Figure 4:
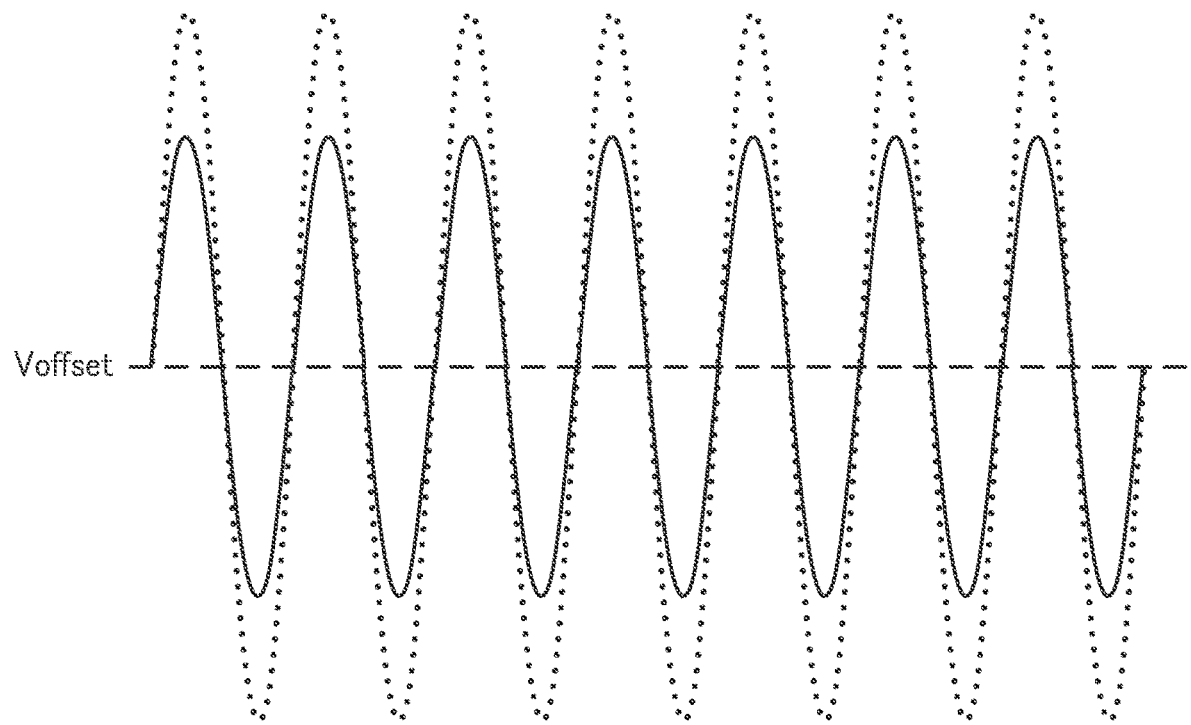
FIG. 4 is a diagram illustrating an example of noise that is attenuated by a low-pass filter.

FIG. 4 is a diagram illustrating an example of noise that is attenuated by the low-pass filter. In FIG. 4, it is assumed that noise is of a sine wave having the predetermined frequency and amplitude, as given by the dotted line. It is also assumed that the voltage level of the drive signal Vdr is a voltage Voffset given by the dashed line. Then, when noise is superimposed on the drive signal Vdr at the node A of FIG. 3, and if there is no Zener diode 30, the input voltage Vin fluctuates around the voltage Voffset as given by the dotted line of FIG. 4.

In addition, components of the noise superimposed at the node A are attenuated by the low-pass filter configured with the parasitic resistance Rp, the parasitic inductance Lp, and the junction capacitance Cb. Then, if the junction capacitance Cb of the Zener diode 30 is taken into consideration and the breakdown voltage Vzd and the forward voltage Vf are not taken into consideration, the input voltage Vin is as given by the solid line. Accordingly, appropriately setting the capacitance value Cb of the junction capacitance Cb reduces the influence of the noise superimposed on the drive signal Vdr.

In addition, as described in FIG. 2, the Zener diode 30 keeps the input voltage Vin between the breakdown voltage Vzd and a negative voltage corresponding to the forward voltage Vf. Accordingly, the input voltage Vin with the noise component attenuated is limited in a voltage range limited by the Zener diode 30, to thereby reduce the influence of the noise on the operation of the control circuit 31. Moreover, in order to operate the control circuit 31 in this manner, the breakdown voltage Vzd of the Zener diode 30 is determined to be higher than the voltage level of the high drive signal Vdr and lower than the amplitude of the noise.

<<<Voltage of First Line LN1 when Noise is Superimposed on Drive Signal Vdr>>>

Figure 5:
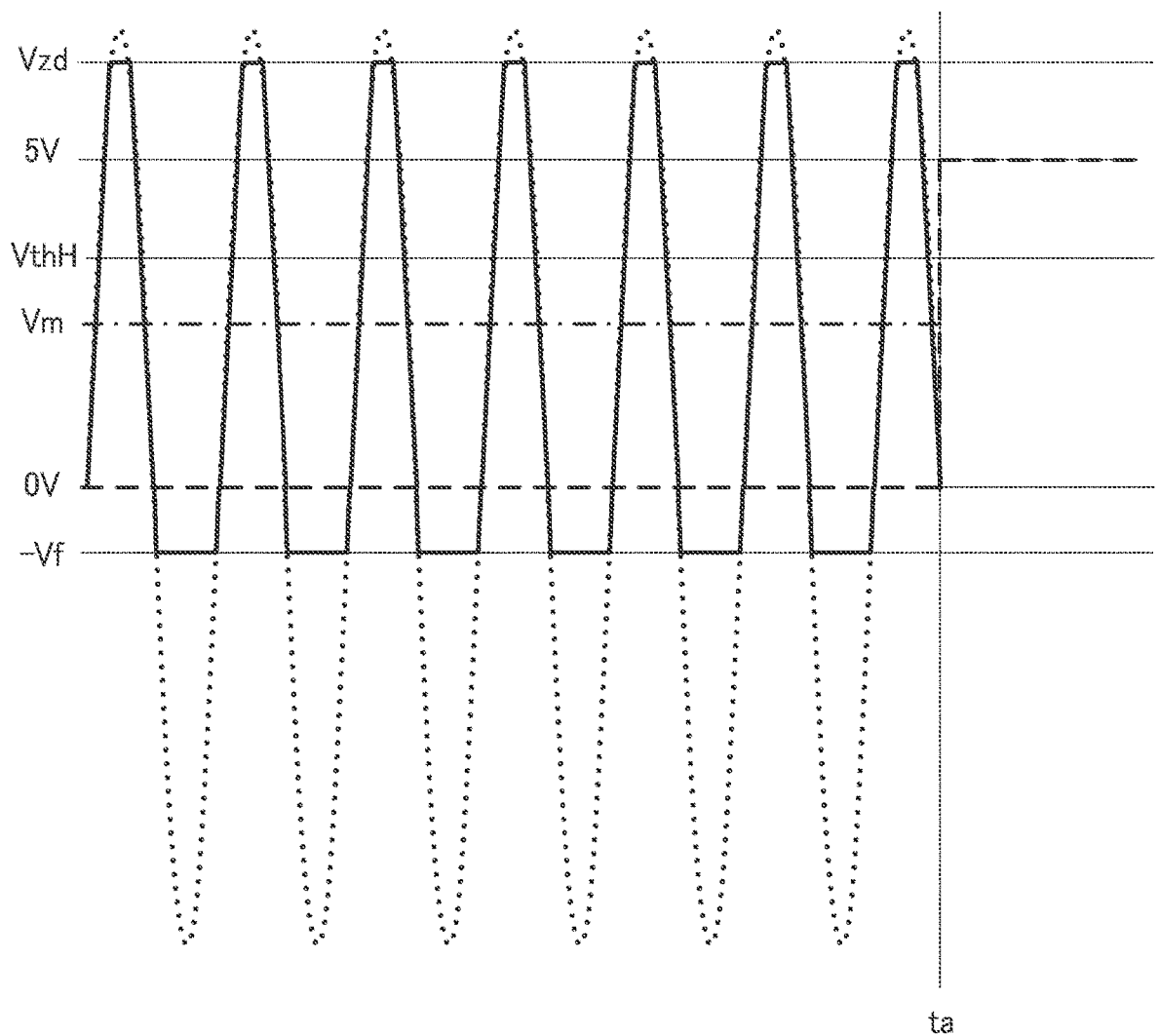
FIG. 5 is a diagram illustrating an example of an input voltage Vin that is applied to a first line LN1, when noise is superimposed on a low-level drive signal Vdr.

FIG. 5 is a diagram illustrating an example of a voltage that is applied to the first line LN1 when the noise is superimposed on the low drive signal Vdr. In FIG. 5, the sine wave given in dotted line is noise and the dashed line represents the drive signal Vdr. In addition, those represented by other dotted lines are, in the order from top, the breakdown voltage "Vzd", "5V" which is the voltage of the high drive signal Vdr, the threshold voltage "VthH", "0V" (ground voltage) which is the voltage of the low drive signal Vdr, and a voltage "−Vf" on the negative voltage side, respectively. In addition, the solid line represents the voltage of the first line LN1, and the dashed-dotted line represents an average value "Vm" of the voltage of the first line LN1.

Before time ta, the input voltage Vin obtained by attenuating the noise fluctuates around 0V as a sine wave. Then, the input voltage Vin rises from 0V, and in response to the input voltage Vin reaching the breakdown voltage Vzd of the Zener diode 30, the voltage applied to the first line LN1 is clamped to the breakdown voltage Vzd. Accordingly, the input voltage Vin that exceeds the breakdown voltage Vzd is not applied to the first line LN1. Then, the input voltage Vin drops, and in response to the input voltage Vin dropping below the breakdown voltage Vzd, the voltage applied to the first line LN1 results in the input voltage Vin.

Then, the input voltage Vin drops, and in response to turning on of the Zener diode 30, the voltage applied to the first line LN1 results in a negative voltage that is negative by an amount corresponding to the forward voltage Vf of the Zener diode 30. Accordingly, part of the input voltage Vin corresponding to an amount of a further drop to a voltage that is further negative with respect to the forward voltage Vf, is not applied to the first line LN1. Furthermore, in response to the input voltage Vin rising and exceeding the negative voltage that is negative by an amount corresponding to the forward voltage Vf, the voltage applied to the first line LN1 results in the input voltage Vin.

Accordingly, the average value "Vm" of the voltage level of the first line LN1 is within the voltage range limited by the Zener diode 30, and does not exceed the threshold voltage VthH of the control circuit 31. Thus, even when noise is superimposed on the low drive signal Vdr, action of the breakdown voltage Vzd of the Zener diode 30 and the junction capacitance Cb restrains the IGBT 33 from being erroneously turned on.

In addition, after the time ta, the ECU 21 outputs the high drive signal Vdr. Further, although noise is still superimposed on the drive signal Vdr after the time ta, it is omitted here for convenience. Note that the operation after the time ta will be described with reference to FIG. 6.

Figure 6:
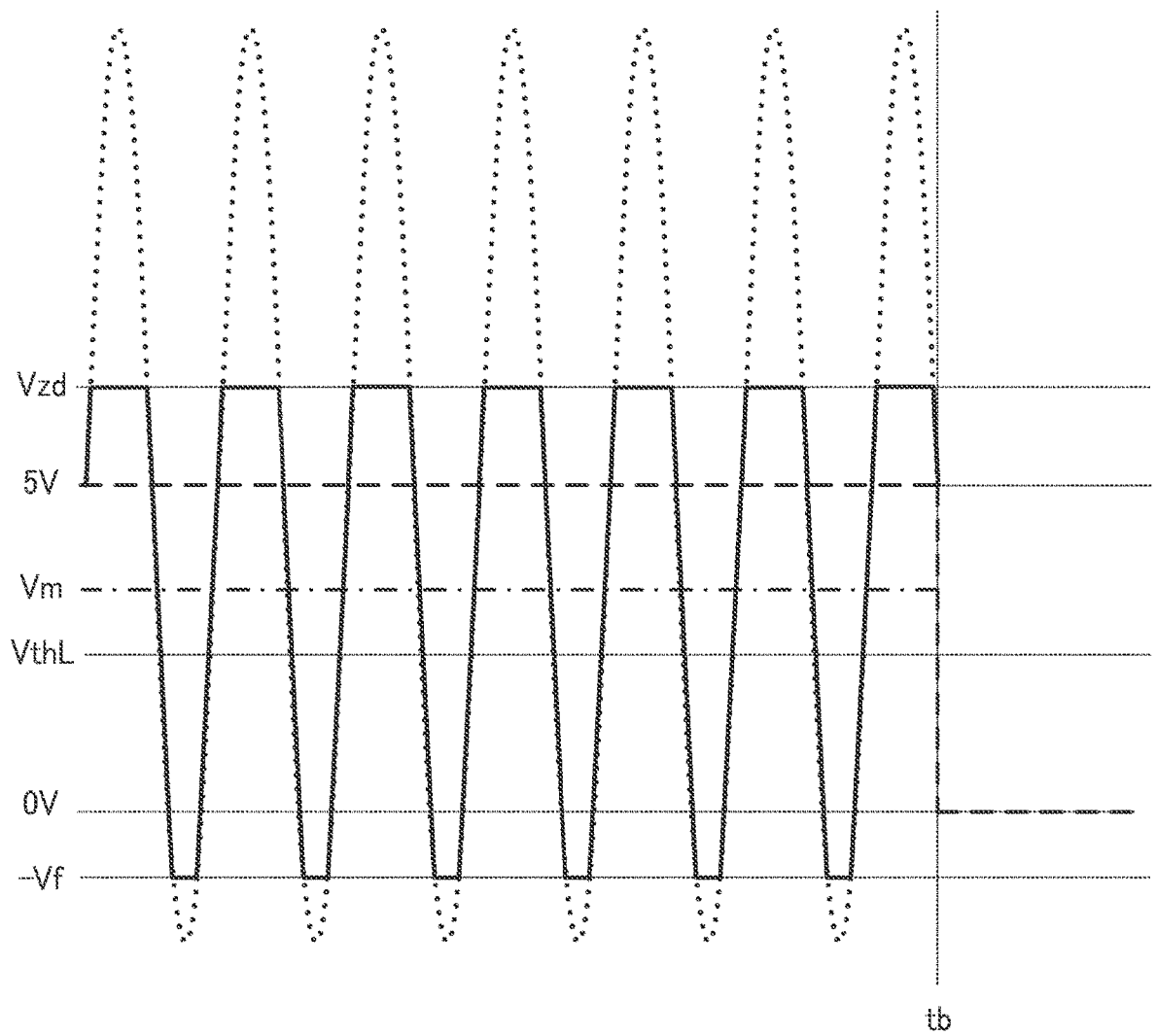
FIG. 6 is a diagram illustrating an example of an input voltage Vin that is applied to a first line LN1, when noise is superimposed on a high-level drive signal Vdr.

FIG. 6 is a diagram illustrating an example of the voltage that is applied to the first line LN1 when the noise is superimposed on the high drive signal Vdr. Lines in FIG. 6 are the same as the lines in FIG. 5, respectively, except for the threshold voltage "VthL" given by the dotted line.

Before time tb, the input voltage Vin obtained by attenuating the noise fluctuates around 5V as a sine wave. Then, the input voltage Vin rises from 5V, and in response to the input voltage Vin reaching the breakdown voltage Vzd of the Zener diode 30, the voltage applied to the first line LN1 is clamped to the breakdown voltage Vzd. Accordingly, the input voltage Vin that exceeds the breakdown voltage Vzd is not applied to the first line LN1. Then, the input voltage Vin drops, and in response to the input voltage Vin dropping below the breakdown voltage Vzd, the voltage applied to the first line LN1 results in the input voltage Vin.

Then, the input voltage Vin drops, and in response to turning on of the Zener diode 30, the voltage applied to the first line LN1 results in a negative voltage that is negative by an amount corresponding to the forward voltage Vf of the Zener diode 30. Accordingly, part of the input voltage Vin corresponding to an amount of a further drop to a voltage that is further negative with respect to the forward voltage Vf, is not applied to the first line LN1. Furthermore, in response to the input voltage Vin rising and exceeding the negative voltage that is negative by an amount corresponding to the forward voltage Vf, the voltage applied to the first line LN1 results in the input voltage Vin.

Accordingly, the average value "Vm" of the voltage level of the first line LN1 is within the voltage range limited by the Zener diode 30, and does not drop below the threshold voltage VthL of the control circuit 31. Thus, even when noise is superimposed on the high drive signal Vdr, the action of the junction capacitance Cb and the breakdown voltage Vzd of the Zener diode 30 restrains the IGBT 33 from being erroneously turned off.

In addition, after the time tb, the ECU 21 outputs the low drive signal Vdr. Further, similarly to FIG. 5, although the noise is still superimposed on the drive signal Vdr after the time tb, it is omitted here for convenience. Note that the operation after the time tb is as described in FIG. 5.

In addition, if the breakdown voltage Vzd of the Zener diode 30 is high, the above-described average value "Vm" of the voltage of the first line LN1 increases, and the IGBT 33 will be erroneously turned on even when the ECU 21 outputs the drive signal Vdr of the ground voltage. Accordingly, in order to keep the average value "Vm" low and not to clamp, at the breakdown voltage Vzd, the drive signal Vdr of 5V outputted by the ECU 21 of an embodiment of the present disclosure, it is desirable in an embodiment of the present disclosure that the breakdown voltage Vzd be set to 6V to 8V. In addition, if the Zener diode 30 is configured with a multiple Zener diodes in series, the capacitance value Cb of the Zener diode 30 decreases. Thus, it is desirable that the Zener diode 30 is not configured with a multiple Zener diodes in series.

SUMMARY

Hereinabove, a description has been given of the igniter 10 according to an embodiment of the present disclosure. The integrated circuit 11 of the igniter 10 includes the Zener diode 30, the control circuit 31, and the IGBT 33. In addition, the Zener diode 30 has the capacitance value Cb so as to be able to control on and off of the IGBT 33, in response to the drive signal Vdr, when the input voltage Vin obtained by superimposing noise on the drive signal Vdr is inputted to the G terminal. In addition, with the action of the junction capacitance Cb and the breakdown voltage Vzd of the Zener diode 30, the integrated circuit 11 can restrain the IGBT 33 from being erroneously turned on and off, even when receiving the input voltage Vin obtained by superimposing the noise on the drive signal Vdr. Accordingly, it is possible to provide an integrated circuit capable of appropriately turning on and off a transistor.

In addition, the cut-off frequency fc of the low-pass filter configured with the parasitic resistance Rp, the parasitic inductance Lp, and the junction capacitance Cb is lower than the frequency of the noise. Accordingly, appropriately setting the capacitance value Cb of the junction capacitance Cb of the Zener diode 30 makes it possible to reduce noise components superimposed on the input voltage Vin.

In addition, the capacitance value Cb of the junction capacitance Cb is 130 pF or higher. This makes it possible for the low-pass filter to sufficiently reduce the noise components of the input voltage Vin, the low-pass filter being configured with the parasitic resistance Rp and the parasitic inductance Lp, which are determined from the distance La of the wiring from the ECU 21 to the igniter 10, and the junction capacitance Cb of the Zener diode 30.

In addition, the breakdown voltage Vzd of the Zener diode 30 is higher than the voltage level of the high drive signal Vdr and lower than the amplitude of the noise. Accordingly, the input voltage Vin that exceeds the voltage range limited by the Zener diode 30 is not inputted to the first line LN1, thereby being able to reduce malfunction of the IGBT 33 more than by simply attenuating the noise only with the junction capacitance Cb.

In addition, the control circuit 31 turns on the IGBT 33 in response to the voltage level of the first line LN1 exceeding the threshold voltage VthH, and turns off the IGBT 33 in response to the voltage level of the first line LN1 dropping below the threshold voltage VthL. Accordingly, in response to the input voltage Vin reaching the predetermined level lower than the threshold voltage VthH, the control circuit 31 restrains, for example, the protection circuit 34 and the limiter circuit 36 from starting to operate.

In addition, the limiter circuit 36 also limits the collector current flowing through the IGBT 33. Accordingly, the limiter circuit 36 can limit, to a predetermined value, the collector current that increases with a predetermined slope in response to turning on of the IGBT 33.

In addition, when the temperature of the IGBT 33 rises, the protection circuit 34 turns off the IGBT 33. This makes it possible to reduce the temperature rise of not only the IGBT 33 but also the igniter 10.

The present disclosure is directed to provision of an integrated circuit capable of appropriately turning on and off a transistor.

According to the present disclosure, it is possible to provide an integrated circuit capable of appropriately turning on and off a transistor.

An Embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. An integrated circuit for controlling an ignition system including a coil, the integrated circuit comprising:
   a transistor configured to control a current flowing through the coil, the transistor having an electrode on a ground side thereof and a control electrode;
   a first line coupled to the control electrode of the transistor, the first line being configured to have a first signal and a second signal inputted thereto, a frequency of the second signal being higher than that of the first signal;
   a second line coupled to the electrode of the transistor on the ground side thereof;
   a control circuit configured to control on and off of the transistor, based on a voltage level of the first line, wherein the control circuit is configured to
      turn on the transistor in response to the voltage level of the first line exceeding a first level, and
      turn off the transistor in response to the voltage level of the first line dropping below a second level;
   a Zener diode having a cathode coupled to the first line and an anode coupled to the second line, the Zener diode having such a capacitance that, responsive to the first signal and the second signal being both inputted to the first line, the control circuit controls the on and off of the transistor in response to the first signal irrespective of the second signal; and
   a limiter circuit configured to
      detect whether or not a current of the transistor is equal to or larger than a predetermined value, in response to the voltage level of the first line reaching a predetermined level lower than the first level before the transistor is turned on by the control circuit, and
      control the transistor such that the current of the transistor decreases, in response to the current of the transistor becoming equal to or larger than the predetermined value.

2. The integrated circuit according to claim 1, wherein the integrated circuit includes a low-pass filter configured at least partially by the capacitance of the Zener diode and a line for transmitting the second signal to the cathode, a cut-off frequency of the low-pass filter being lower than the frequency of the second signal.

3. The integrated circuit according to claim 1, wherein the capacitance of the Zener diode is 130 pF or higher.

4. The integrated circuit according to claim 1, wherein a breakdown voltage of the Zener diode is higher than a level of the first signal at a time when the transistor is turned on, and lower than an amplitude of the second signal.

5. The integrated circuit according to claim 1, wherein the integrated circuit is an igniter.

6. An integrated circuit for controlling an ignition system including a coil, the integrated circuit comprising:
   a transistor configured to control a current flowing through the coil, the transistor having an electrode on a ground side thereof and a control electrode;
   a first line coupled to the control electrode of the transistor, the first line being configured to have a first signal and a second signal inputted thereto, a frequency of the second signal being higher than that of the first signal;
   a second line coupled to the electrode of the transistor on the ground side thereof;
   a control circuit configured to control on and off of the transistor, based on a voltage level of the first line, wherein the control circuit is configured to
      turn on the transistor in response to the voltage level of the first line exceeding a first level, and
      turn off the transistor in response to the voltage level of the first line dropping below a second level;
   a Zener diode having a cathode coupled to the first line and an anode coupled to the second line, the Zener diode having such a capacitance that, responsive to the first signal and the second signal being both inputted to the first line, the control circuit controls the on and off of the transistor in response to the first signal irrespective of the second signal; and
   a protection circuit configured to
      detect whether or not a temperature of the transistor is equal to or higher than a predetermined value, in response to the voltage level of the first line reaching a predetermined level lower than the first level before the transistor is turned on by the control circuit, and
      turn off the transistor in response to the temperature of the transistor becoming equal to or higher than the predetermined value.

7. The integrated circuit according to claim 6, wherein the integrated circuit includes a low-pass filter configured at least partially by the capacitance of the Zener diode and a line for transmitting the second signal to the cathode, a cut-off frequency of the low-pass filter being lower than the frequency of the second signal.

8. The integrated circuit according to claim 6, wherein the capacitance of the Zener diode is 130 pF or higher.

9. The integrated circuit according to claim 6, wherein a breakdown voltage of the Zener diode is higher than a level of the first signal at a time when the transistor is turned on, and lower than an amplitude of the second signal.

10. The integrated circuit according to claim 6, wherein the integrated circuit is an igniter.

* * * * *